United States Patent [19]

Chao

[11] 3,790,828

[45] Feb. 5, 1974

[54] ELECTROACOUSTIC SURFACE ACOUSTIC WAVE BEAM DEFLECTOR

[75] Inventor: Gene Chao, Alexandria, Va.

[73] Assignee: The United States of America as represented by the Secretary of the Navy, Washington, D.C.

[22] Filed: June 23, 1972

[21] Appl. No.: 265,867

[52] U.S. Cl. .................. 310/9.7, 310/9.8, 333/30 R
[51] Int. Cl. .......................................... H04r 17/00
[58] Field of Search ...... 310/8.1, 9.7, 9.8; 333/30 R

[56] References Cited

UNITED STATES PATENTS

| | | | |
|---|---|---|---|
| 3,696,313 | 10/1972 | Adler | 310/9.8 X |
| 3,675,163 | 7/1972 | Hartmann et al. | 333/30 R |
| 3,659,231 | 4/1972 | De Vries | 310/9.8 X |
| 3,559,115 | 1/1971 | De Vries | 333/30 R X |
| 3,582,540 | 6/1971 | Adler et al. | 333/30 R X |
| 3,600,710 | 8/1971 | Adler et al. | 333/30 R X |

OTHER PUBLICATIONS

Tapping Microwave Acoustics For Better Signal Processing, Electronics, Nov. 10, 1969, pp. 94–103, by Altman et al.

*Primary Examiner*—William M. Shoop, Jr.
*Assistant Examiner*—Mark O. Budd
*Attorney, Agent, or Firm*—R. S. Sciascia; Arthur L. Branning; Philip Schneider

[57] ABSTRACT

Means for reflecting a microwave surface acoustic wave to provide long delays (long path length) on normally sized piezoelectric crystals comprising reflecting transducers, each consisting of a pair of interdigital transducers in a back-to-back arrangement with electrical components for tuning out the distributed capacity of the transducers and for loading the transducers for maximum efficiency relative to their radiation resistance. The transducers and components are fabricated as thin films on a piezoelectric crystal substrate.

5 Claims, 5 Drawing Figures

PATENTED FEB 5 1974 3,790,828

ELECTROACOUSTIC SURFACE ACOUSTIC WAVE BEAM DEFLECTOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to microwave acoustics and especially to improved means for delaying surface acoustic waves at microwave frequencies.

In the field of microwave acoustics, it is often necessary to delay the acoustic waves. Present requirements for surface acoustic wave delays often require propagation lengths of ten to thirty inches or more on currently used crystals. However, fabrication techniques limit crystal length to some six to ten inches. It is thus desirable to reflect beams back and forth to increase the surface propagation length.

Present beam reflection devices are gratings which are either etched into or deposited on the crystal surface. In the case of deposited gratings, a dielectric material is used. This method is limited in several ways, namely:

1. The grating depth or height must be critically controlled;
2. Energy is often lost to bulk wave conversion;
3. The amount of energy which is deflected is fixed by the grating depth or height;
4. It takes two gratings to fold a beam back parallel to itself;
5. Phase coherence is difficult to maintain after deflection.

BRIEF SUMMARY OF THE INVENTION

The present invention comprises a pair of interdigital acoustic transducers mounted on a piezoelectric substrate and constructed so that they are in a back-to-back arrangement. The acoustic wave is projected so that it strikes only one of the transducers. Electrical energy induced in this transducer is fed into the other transducer which generates an acoustical wave and sends it back in the direction from which the original acoustic wave came.

An object of this invention is to provide improved reflection of surface acoustic waves having wavelengths lying in the microwave spectral region.

Other objects, advantages and novel features of the invention will become apparent from the following detailed description of the invention when considered in conjunction with the accompanying drawings wherein:

DETAILED DESCRIPTION

Figure 1:
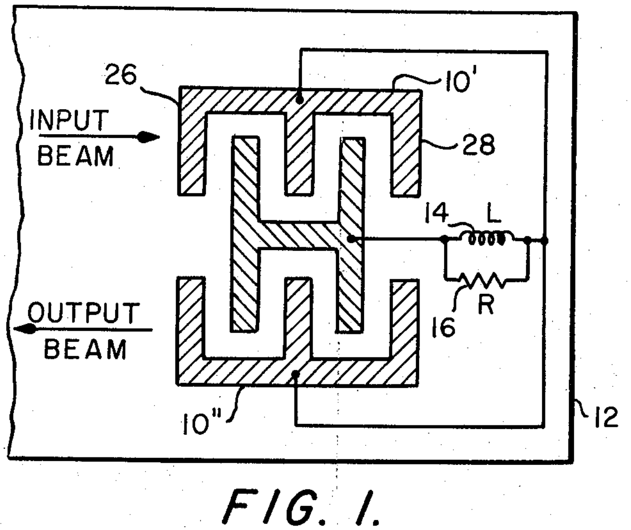
FIG. 1 is a plan view of an interdigital acoustic transducer in accordance with the present invention.

FIG. 1 shows the details of a pair of interdigital acoustic transducers 10' and 10'' comprising a thin film of metal such as aluminum or gold deposited on a piezoelectric substrate 12. The substrate may be a material such as lithium niobate, quartz, or bismuth germanium oxide. The film is laid down in the form of a pair of E's facing each other and spaced sufficiently to allow an H to be interdigitated between the fingers of the E's, as shown. An inductance 14 and load resistance 16 are arranged in parallel so that one side connects to the H and the other side to both E's.

The upper E and upper half of the H form one transducer 10' and the lower E and lower half of the H form a second transducer 10''. The inductance and resistance may also be formed from metallic films on the surface of the substrate. It should be noted that a single transducer consists of an E form interdigitated with a U form.

Figure 2:
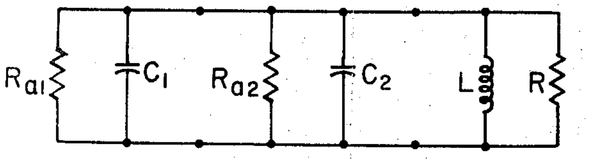
FIG. 2 is a circuit diagram showing how the transducer and its associated components look electrically.

The equivalent electrical circuit is shown in FIG. 2. Each transducer looks like a capacitor (the capacitance between the E and H films) in parallel with a resistance (the radiation resistance of the transducer). The inductor and resistance are in parallel with these components. The value of inductance is chosen to resonate with the value of parallel capacitance in the circuit at the frequency of the acoustic wave. The value of the resistance 16 is chosen to be the same as the parallel radiation resistance for maximum efficiency of energy return.

Figure 3:
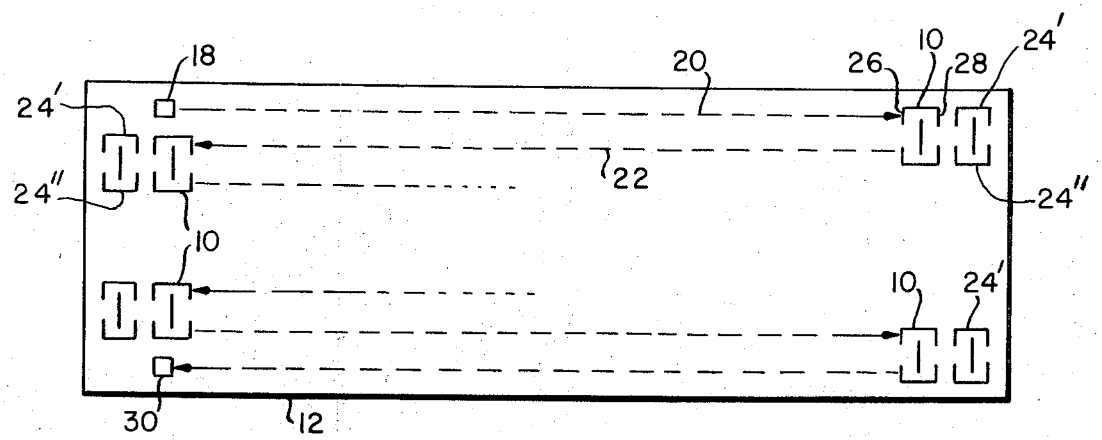
FIG. 3 is an illustration showing how reflecting transducers can be used to increase the propagation path of a surface acoustic wave.

The way in which the transducers 10' and 10'' are used is shown in FIG. 3. An acoustic transducer 18 generates a surface acoustic wave 20 on the substrate. The reflecting transducer 10 is placed so that the wave 20 strikes the surface of the front leg 26 of the upper E. The back surface 28 of the upper E sends an acoustic wave towards a second transducer 24' and the front surface of the lower E sends a reflected wave 22 in the direction from which the original wave 20 came.

Figure 4:
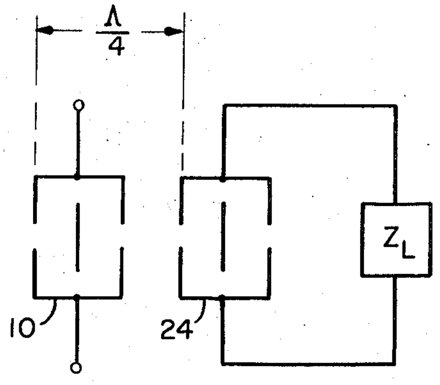
FIG. 4 is a schematic illustration of a reflecting transducer and a forward-wave canceller.

A second pair of transducers 24' and 24'' are placed behind the first at a quarter-wavelength spacing. The action of these transducers 24' and 24'' is to cancel the reflected wave from the front surface of the upper E by an interference effect and to augment the wave 22 sent back by the front surface of the lower E by a reinforcement effect. As can be seen from FIG. 4, the second pair of transducers 24' and 24'', which for lack of a better term are designated the backup transducers, also have a load impedance coupled to them, although the load impedance is not shown in FIG. 3 for purposes of clarity of the diagram. The load impedance, Z, is chosen to resonate the parallel capacitance of the transducers.

The placement of two interdigital acoustic transducers in this back-to-back, or parallel, circuit arrangement makes possible a direct reflection of the acoustic wave by the pair of transducers, thereby avoiding the losses which occur in the usual arrangement where reflection might be made by two transducers, the receiving and transmitting transducers being coupled to their own electrical circuits. Here a single electrical circuit suffices for both transducer units and there is no transformation loss. There is no need for matching transducer impedance — the matching is to the combined radiation resistance, or it might be said that the matching is to the acoustic wave itself.

The deflected energy may be varied by varying the load resistor 16; in fact, gain may be achieved if the resistor 16 is replaced by a negative resistance amplifier.

More reflecting 10 and backup 24 transducers are arranged in a line at the edges of the substrate 12 to reflect the acoustic wave back and forth over a long path so that a long time delay of the wave is attained. Finally, the wave is received by a receiving transducer 30. If the substrate is lithium niobate, the delay is on the order of $3\mu$ sec per cm. An acoustic beam of 100 MHZ may have a beam width of about 0.025 inches. A single crystal of substrate may be about 6 inches long and one to two inches wide. Thus, there may be about 20 beams per inch of width of the crystal and a delay of about 1 millisecond may be attained.

Figure 5:
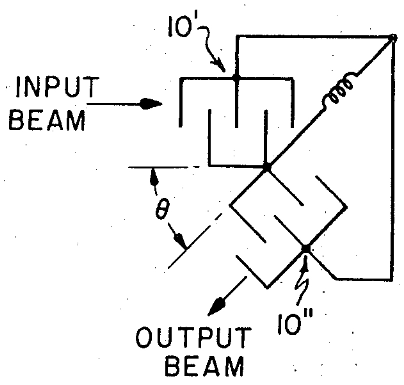
FIG. 5 is a schematic illustration of two transducers arranged to reflect the acoustic wave at an angle, $\theta$, to the incoming wave.

It is of course apparent that the angle of reflection $\theta$ can be changed by changing the angle between the upper 10' and lower 10'' halves of the reflecting transducer, as shown in FIG. 5.

Obviously many modifications and variations of the present invention are possible in light of the above teachings. It is therefore to be understood that within the scope of the appended claims the invention may be practiced otherwise than as specifically described.

I claim:

1. Means for reflecting a microwave acoustic wave traveling on the surface of a piezoelectric crystal comprising:

a piezoelectric crystal;

a pair of interdigitated transducers, each fabricated from a thin film consisting of an E form and an interdigitated U form, said U forms being placed in back-to-back contact thereby forming an internal H form; and impedance means fabricated from a thin film, all said films being deposited on said crystal surface, said impedance means being connected at one end to both said E forms and at the other end to said H form, so that said transducers are connected in parallel with each other, said acoustic wave striking the front surface of one leg of one transducer and a reflected wave being propagated from the front surface of the corresponding leg of the other transducer.

2. Means as in claim 1, wherein said impedance means comprises an inductor in parallel with a resistor.

3. Means as in claim 2, the value of said inductor being that required to resonate the distributed capacity of said transducers as seen by the inductor and the value of said resistor being equal to the radiation resistance of said transducers as seen by said resistor.

4. Means as in claim 1, further including a pair of backup interdigital transucers located behind said reflecting transducers relative to said incoming acoustic wave at a distance such that the front surfaces of corresponding legs of the reflecting and backup transducers are a quarter-wavelength apart; and a load impedance comprising means for matching the distributed capacities and radiation resistances of said backup transducers to the radiation resistances of said reflecting transducers as seen by said backup transucers, said pair of backup transducers also being in a back-to-back circuit arrangement and in parallel with the load impedance.

5. A plurality of means as in claim 4, arranged in two spaced columns wherein each unit in a column comprises a pair of reflecting transducers and a pair of backup transducers, the reflecting transducers in each column facing each other and being spatially arranged so that an acoustic wave is reflected from one unit in a given column to the next lower unit in the other column.

* * * * *